US008493124B2

(12) United States Patent
Chern et al.

(10) Patent No.: US 8,493,124 B2

(45) Date of Patent: Jul. 23, 2013

(54) LOW MINIMUM POWER SUPPLY VOLTAGE LEVEL SHIFTER

(75) Inventors: Chan-Hong Chern, Palo Alto, CA (US); Fu-Lung Hsueh, Cranbury, NJ (US); Ming-Chieh Huang, San Jose, CA (US); Chih-Chang Lin, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 20 days.

(21) Appl. No.: 12/843,479

(22) Filed: Jul. 26, 2010

(65) Prior Publication Data

US 2012/0019302 A1 Jan. 26, 2012

(51) Int. Cl.
*H03L 5/00* (2006.01)

(52) U.S. Cl.
USPC ................................ 327/333; 326/62; 326/81

(58) Field of Classification Search
USPC .................. 326/62–63, 80–81; 327/306, 333
See application file for complete search history.

(56) References Cited

U.S. PATENT DOCUMENTS

| | | | | |
|---|---|---|---|---|
| 5,136,190 | A * | 8/1992 | Chern et al. | 326/81 |
| 6,677,798 | B2 * | 1/2004 | Chang et al. | 327/333 |
| 7,705,631 | B2 * | 4/2010 | Chen | 326/81 |
| 7,755,392 | B1 * | 7/2010 | Ku | 326/68 |
| 7,804,326 | B1 * | 9/2010 | Chen | 326/68 |
| 7,839,170 | B1 * | 11/2010 | Yang et al. | 326/68 |

* cited by examiner

*Primary Examiner* — Dinh T. Le

(74) *Attorney, Agent, or Firm* — Lowe Hauptman Ham & Berner, LLP

(57) ABSTRACT

A level shifter includes one PMOS and two NMOS transistors. A source of the first NMOS transistor is coupled to a low power supply voltage. An input signal is coupled to a gate of the first NMOS transistor and a source of the second NMOS transistor. The input signal has a voltage level up to a first power supply voltage. A source of the PMOS transistor is coupled to a second power supply voltage, higher than the first power supply voltage. An output signal is coupled between the PMOS and the first NMOS transistors. The first NMOS transistor is arranged to pull down the output signal when the input signal is a logical 1, and the second NMOS transistor is arranged to enable the PMOS transistor to pull up the output signal to a logical 1 at the second power supply voltage when the input signal is a logical 0.

18 Claims, 3 Drawing Sheets

LOW MINIMUM POWER SUPPLY VOLTAGE LEVEL SHIFTER

TECHNICAL FIELD

The present disclosure relates generally to an integrated circuit, more particularly a level shifter.

BACKGROUND

To reduce power consumption and enhance the performance per area, some integrated circuits, e.g., central processing unit (CPU), graphics processing unit (GPU), system on chip (SOC) have reduced the core operating voltage, while the surrounding chips or peripheral circuits, e.g., input-output (TO), still operate at higher voltages due to legacy and/or for backward compatibility. Level shifting is used for adjusting voltage differences from the core logic to IO interfaces.

In order to further reduce the power consumption of the core chip or core circuits, the power supply of the core chip or core circuits is decreased as much as possible without causing the core logic circuits (such as cache, register files, jam-latch sequential logics) to fail during operation (such as write or read mode) or standby situations. The minimum core-logic supply voltage is referred to as the Vccmin.

A high-voltage level shifter needs to be able to operate below or at close to the minimum operable power supply voltage of the core logic circuits. However, conventional high-voltage level shifters have problems operating at low Vccmin, e.g., fail level shifting or have very slow output slew rate.

Accordingly, new circuits and methods are desired to solve the above problems.

BRIEF DESCRIPTION OF THE DRAWINGS

The present disclosure will be readily understood by the following detailed description in conjunction with the accompanying. Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
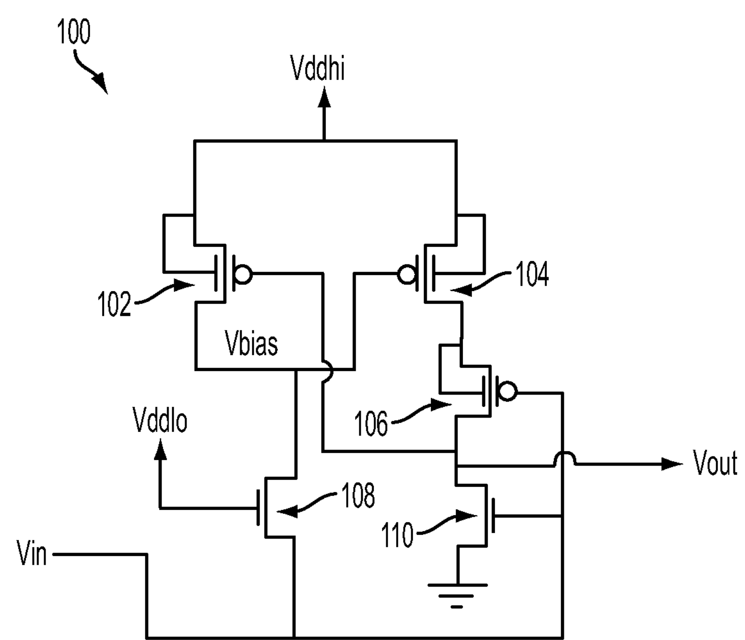
FIG. 1 is a schematic diagram showing an exemplary level shifter according to some embodiments.

FIG. 1 is a schematic diagram showing an exemplary level shifter according to some embodiments. The level shifter 100 includes PMOS transistors 102, 104, and 106, and NMOS transistor 108 and 110. The input signal Vin is coupled to the source of NMOS transistor 108 and gates of the NMOS transistor 110 and PMOS transistor 106. The output signal Vout is coupled to the gate of PMOS transistor 102 and between drains of NMOS transistor 110 and PMOS transistor 106. The gate of NMOS transistor 108 is coupled to a first power supply voltage, i.e., Vddlo. The sources of PMOS transistors 102 and 104 are coupled to a second power supply voltage, i.e., Vddhi, which is higher than Vddlo. The drain of NMOS transistor 108 is coupled to the drain of the PMOS transistor 102 and the gate of the PMOS transistor 104. The source of the NMOS transistor 110 is coupled to a low power supply voltage, i.e., a ground.

The input signal Vin has a voltage level up to Vddlo. For Vin at a logical 1 (e.g., Vddlo), NMOS transistor 110 is turned on and immediately pulls down Vout toward a logical 0, and at the same time, the PMOS transistor 106 is shut off by Vin to disconnect PMOS transistor 104 from Vout, preventing the PMOS transistor 104 from pulling up Vout. Once the Vout is pulled down low enough by the NMOS transistor 110, the voltage Vbias at the gate of PMOS transistor 104 is strongly held at Vddhi by PMOS transistor 102, which completely turns off the PMOS transistor 104. For Vin at a logical 0, Vbias is quickly pulled down by a strong (i.e., with sufficient current capability) NMOS transistor 108 to turn on the PMOS transistor 104, which quickly pulls up Vout to a logical 1 (e.g., Vddhi). Thus, a level shifting from the lower voltage level Vddlo (Vin) to the higher voltage level Vddhi (Vout) is achieved.

In one embodiment, with Vddhi=1.5V, Vccmin (i.e., minimum Vddlo) can be lowered below 0.62 V, providing about 100 mV lower Vccmin compared to a conventional level shifter circuit. For a comparison between the conventional circuit and the embodiment in FIG. 1 having comparable slew rates (i.e., a signal change rate or slope), more than 115 mV of Vccmin improvements can be achieved.

Figure 2:
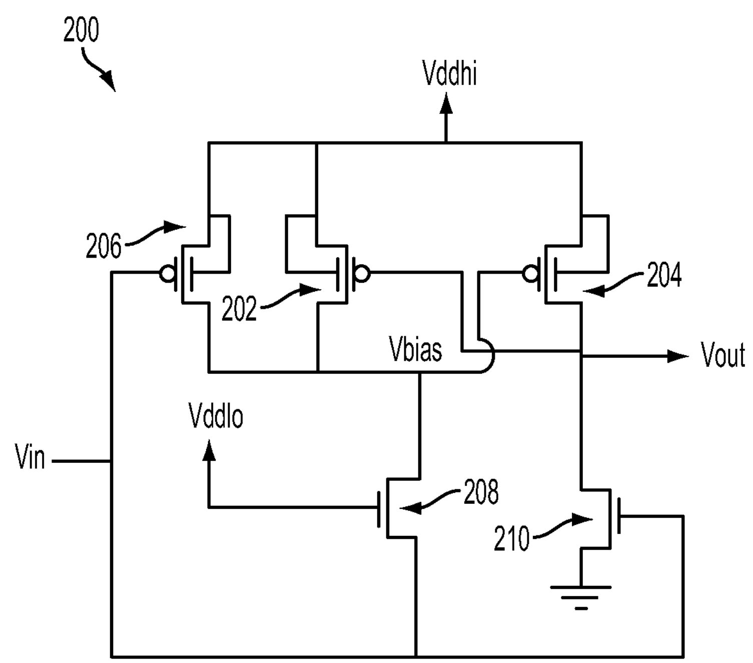
FIG. 2 is a schematic diagram showing another exemplary level shifter according to some embodiments.

FIG. 2 is a schematic diagram showing another exemplary level shifter according to some embodiments. The level shifter circuit 200 is similar to the circuit 100 in FIG. 1, except that a PMOS transistor 206 is added and the PMOS transistor 106 (shown in FIG. 1) is not used. The source of PMOS transistor 206 is coupled to Vddhi, its drain is coupled to the gate of PMOS transistor 204, and its gate is coupled to Vin. Vout is coupled between the drains of PMOS transistor 204 and NMOS transistor 210.

For Vin at a logical 1 (e.g., Vddlo), NMOS transistor 210 is turned on and immediately pulls down Vout. At the same time, a weak (i.e., with limited current capability) PMOS 206 is turned on (because Vddlo at its gate is lower than Vddhi at its source by about its threshold voltage) and pulls up Vbias to a logical 1 (e.g., Vddhi), which turns off PMOS transistor 204. The lower the Vddlo, the faster the Vbias is pulled up by PMOS transistor 206 to a logical 1 (e.g., Vddhi) to turn off PMOS transistor 204. The earlier the PMOS transistor 204 is turned off, the faster Vout can be pulled down by the NMOS transistor 210. Once Vout is pulled down low enough by the NMOS transistor 210, Vbias is strongly held at a logical 1 (e.g., Vddhi) by the PMOS transistor 202. For Vin at a logical 0, Vbias is quickly pulled down by a strong NMOS transistor 208 to turn on the PMOS transistor 204, which quickly pulls up Vout to a logical 1 (e.g., Vddhi). Thus, a level shifting from the lower voltage level Vddlo (Vin) to the higher voltage level Vddhi (Vout) is achieved.

In one embodiment, with Vddhi=1.5V, Vccmin (i.e., minimum Vddlo) can be lowered below 0.58 V, providing about 140 mV lower Vccmin compared to a conventional level shifter circuit. For a comparison between the conventional circuit and the embodiment in FIG. 2 having comparable slew rates (i.e., a signal change rate or slope), about 160 mV of Vccmin improvements can be achieved.

In both level shifter circuits 100 and 200, the input signal Vin is coupled directly to devices, e.g., the source of NMOS transistor 108 and gates of NMOS transistor 110 and PMOS transistor 106 for the circuit 100, and the source of NMOS transistor 208 and gates of NMOS transistor 210 and PMOS transistor 206 for the circuit 200. Therefore, there is no extra delay from Vin to these devices that can affect the timing of the circuit operation. (In some conventional circuits, such an extra delay occurs by using an inverter in one of the paths between Vin and other devices.) Also, in some embodiments of circuits 100 and 200, the power consumption can be reduced because of lower Vccmin.

Figure 3:
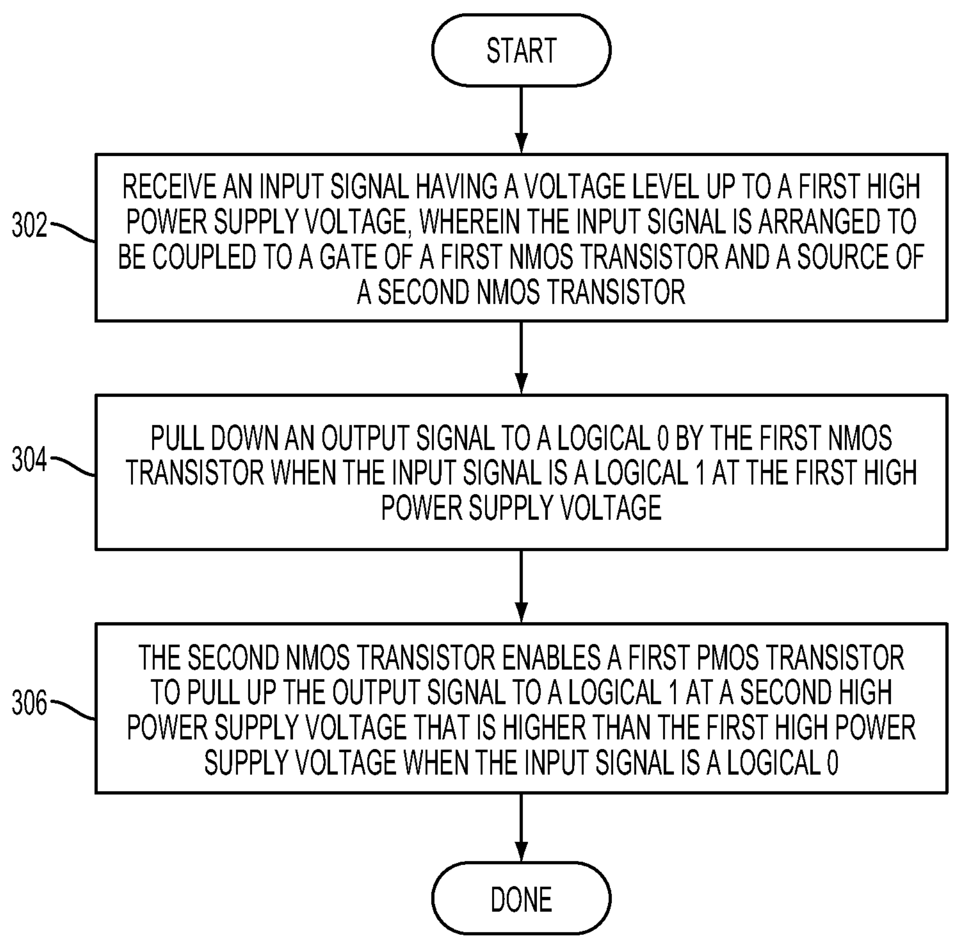
FIG. 3 is a flowchart for a method of the exemplary circuits shown in FIG. 1 and/or FIG. 2 according to some embodiments.

FIG. 3 is a flowchart for a method of the exemplary circuits shown in FIG. 1 and/or FIG. 2 according to some embodiments. At step 302, an input signal, e.g., Vin, having a voltage level up to a first power supply voltage, e.g., Vddlo, is received. The input signal, e.g., Vin, is arranged to be coupled to a gate of a first NMOS transistor, e.g., 110 or 210, and a source of a second NMOS transistor, e.g., 108 or 208.

At step 304, an output signal, e.g., Vout, is pulled down to a logical 0 by the first NMOS transistor, e.g., 110 or 210, when the input signal, e.g., Vin, is a logical 1 at the first power supply voltage, e.g., Vddlo.

At step 306, the second NMOS transistor, e.g., 108 or 208, enables a first PMOS transistor, e.g., 104 or 204, to pull up the output signal, e.g., Vout, to a logical 1 at a second power supply voltage, Vddhi that is higher than the first power supply voltage, e.g., Vddlo, when the input signal, e.g., Vin, is a logical 0.

The method can further comprise a second PMOS transistor, e.g., 106 or 206, preventing the first PMOS transistor, e.g., 104 or 204, from pulling up the output signal, e.g., Vout, to a logical 1 when the input signal, e.g., Vin, is a logical 1.

A level shifter according to some embodiments includes a first NMOS transistor and a source of the first NMOS transistor is arranged to be coupled to a low power supply voltage. The level shifter also includes a second NMOS transistor. A voltage input node is arranged to receive an input signal and to be coupled to a gate of the first NMOS transistor and a source of the second NMOS transistor. The input signal has a voltage level up to a first power supply voltage. A source of a PMOS transistor is arranged to be coupled to a second power supply voltage that is higher than the first power supply voltage. A voltage output node is arranged to supply an output signal and to be coupled between the first PMOS transistor and the first NMOS transistor. The first NMOS transistor is arranged to pull down the output signal to a logical 0 when the input signal is a logical 1, and the second NMOS transistor is arranged to enable the first PMOS transistor to pull up the output signal to a logical 1 at the second power supply voltage when the input signal is a logical 0.

A method for a level shifter according to some embodiments includes receiving an input signal having a voltage level up to a first power supply voltage. The input signal is arranged to be coupled to a gate of a first NMOS transistor and a source of a second NMOS transistor. The method also includes pulling down an output signal to a logical 0 by the first NMOS transistor when the input signal is a logical 1 at the first power supply voltage. The method further includes the second NMOS transistor enabling a first PMOS transistor to pull up the output signal to a logical 1 at a second power supply voltage that is higher than the first power supply voltage when the input signal is a logical 0.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure.

What is claimed is:

1. A level shifter, comprising:

a first NMOS transistor, a source of the first NMOS transistor arranged to be coupled to a low power supply voltage;

a second NMOS transistor;

a voltage input node arranged to receive an input signal and coupled to a gate of the first NMOS transistor and a source of the second NMOS transistor, wherein the input signal has a voltage level up to a first power supply voltage;

a first PMOS transistor configured to selectively turn completely off, a source of the first PMOS transistor arranged to be coupled to a second power supply voltage that is higher than the first power supply voltage, a gate of the first PMOS transistor arranged to be coupled to a drain of the second NMOS transistor;

a voltage output node arranged to supply an output signal and to be coupled between the first PMOS transistor and the first NMOS transistor;

a second PMOS transistor, a source of the second PMOS transistor arranged to be coupled to the second power supply voltage and a drain of the second PMOS transistor arranged to be coupled to a drain of the second NMOS transistor; and a third PMOS transistor arranged to be coupled to the first PMOS transistor, wherein a gate of the third PMOS transistor is coupled to the voltage input node, wherein the first NMOS transistor is arranged to pull down the output signal to a low logic level when the input signal is a first logic level, and the second NMOS transistor is arranged to enable the first PMOS transistor to pull up the output signal to a high logic level at the second power supply voltage when the input signal is a second logic level.

2. The level shifter of claim 1, wherein a gate of the second NMOS transistor is arranged to be coupled to the first power supply voltage.

3. The level shifter of claim 1, wherein the third PMOS transistor is arranged to be coupled between the first PMOS transistor and the voltage output node to prevent the first PMOS transistor from pulling up the output signal to the high logic level when the input signal is at the first logic level.

4. The level shifter of claim 3, wherein a source of the third PMOS transistor is coupled to a drain of the first PMOS transistor.

5. The level shifter of claim 3, wherein a drain of the third PMOS transistor is coupled to a drain of the first NMOS transistor.

6. The level shifter of claim 3, wherein a source of the third PMOS transistor is arranged to be coupled to the second power supply voltage.

7. The level shifter of claim 3, wherein a drain of the second PMOS transistor is coupled to the gate of the first PMOS transistor.

8. The level shifter of claim 1, wherein a drain of the third PMOS transistor is coupled to a gate of the first PMOS transistor.

9. A method for a level shifter, comprising:

receiving an input signal having a voltage level up to a first power supply voltage, wherein the input signal is arranged to be coupled to a gate of a first NMOS transistor and a source of a second NMOS transistor;

pulling down an output signal to a low logic level by the first NMOS transistor when the input signal is a first logic level at the first power supply voltage;

preventing a first PMOS transistor from pulling up the output signal when the input signal is the first logic level by coupling a drain of a second PMOS transistor to a gate of the first PMOS transistor and a drain of the second NMOS transistor during an entire period of operation to selectively turn completely off the first PMOS transistor, and coupling a third PMOS transistor to the first PMOS transistor;

coupling the input signal to a gate of the third PMOS transistor; and pulling up the output signal to a high logic level by the first PMOS transistor coupled to a second power supply voltage that is higher than the first power supply voltage when the input signal is a second logic level.

10. The method of claim 9, further comprising coupling a gate of the second NMOS transistor to the first power supply voltage.

11. The method of claim 9, further comprising preventing the first PMOS transistor from pulling up the output signal to a high logic level when the input signal is a first logic level by coupling the third PMOS transistor between the first PMOS transistor and the voltage output node.

12. The method of claim 11, further comprising coupling a source of the third PMOS transistor to a drain of the first PMOS transistor.

13. The method of claim 11, further comprising coupling a drain of the third PMOS transistor to a drain of the first NMOS transistor.

14. The method of claim 11, further comprising coupling a source of the third PMOS transistor to the second power supply voltage.

15. The method of claim 11, further comprising coupling a drain of the second PMOS transistor to the gate of the first PMOS transistor.

16. The method of claim 11, further comprising coupling a drain of the third PMOS transistor to the gate of the first PMOS transistor.

17. A level shifter, comprising:

a first NMOS transistor, a source of the first NMOS transistor arranged to be coupled to a low power supply voltage;

a second NMOS transistor, a gate of the second NMOS transistor arranged to be coupled to a first power supply voltage;

a voltage input node arranged to receive an input signal and coupled to a gate of the first NMOS transistor and a source of the second NMOS transistor, wherein the input signal has a voltage level up to the first power supply voltage;

a first PMOS transistor configured to selectively turn completely off, a source of the first PMOS transistor arranged to be coupled to a second power supply voltage that is higher than the first power supply voltage;

a voltage output node arranged to supply an output signal and to be coupled between the first PMOS transistor and the first NMOS transistor;

a second PMOS transistor, a source of the second PMOS transistor arranged to be coupled to the second power supply voltage and a drain of the second PMOS transistor arranged to be coupled to a drain of the second NMOS transistor during an entire period of operation arranged to prevent the first PMOS transistor from pulling up the output signal to a high logic level when the input signal is a first logic level;

a third PMOS transistor coupled to the first PMOS transistor, the third PMOS transistor having a gate coupled to the voltage input signal, wherein the first NMOS transistor is arranged to pull down the output signal to a low logic level when the input signal is the first logic level, and the second NMOS transistor is arranged to enable the first PMOS transistor to pull up the output signal to the high logic level at the second power supply voltage when the input signal is a second logic level.

18. The level shifter of claim 17, wherein a gate of the first PMOS transistor the drain of the second PMOS transistor.

* * * * *